(12) United States Patent
Balut et al.

(10) Patent No.: US 9,799,637 B2
(45) Date of Patent: Oct. 24, 2017

(54) SEMICONDUCTOR PACKAGE WITH LID HAVING LID CONDUCTIVE STRUCTURE

(71) Applicant: Qorvo US, Inc., Greensboro, NC (US)

(72) Inventors: Brian P. Balut, Mount Dora, FL (US); Jonathan Fain, Sachse, TX (US); Kevin J. Anderson, Plano, TX (US); Tarak A. Railkar, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/292,464

(22) Filed: Oct. 13, 2016

(65) Prior Publication Data

US 2017/0236808 A1    Aug. 17, 2017

Related U.S. Application Data

(60) Provisional application No. 62/294,381, filed on Feb. 12, 2016.

(51) Int. Cl.
*H01L 23/12* (2006.01)
*H01L 25/16* (2006.01)
(Continued)

(52) U.S. Cl.
CPC ........ *H01L 25/165* (2013.01); *H01L 23/5386* (2013.01); *H01L 24/49* (2013.01);
(Continued)

(58) Field of Classification Search
CPC ............... H01L 25/165; H01L 23/5386; H01L 2924/161; H01L 2924/1205; H01L 2924/1206
(Continued)

(56) References Cited

U.S. PATENT DOCUMENTS 5,159,433 A * 10/1992 Kazami ............. H01L 21/67121
257/681
5,274,913 A    1/1994 Grebe et al.
(Continued)

OTHER PUBLICATIONS

Author Unknown, "Package-in Package (PIP)," Stats ChipPAC Ltd., 2015, 2 pages, http://www.statschippac.com/packaging/packaging/wirebond/laminate/pip.aspx.
(Continued)

*Primary Examiner* — Nitin Parekh
(74) *Attorney, Agent, or Firm* — Withrow & Terranova, P.L.L.C.

(57) ABSTRACT

The present disclosure relates to a semiconductor package with a lid that includes a lid conductive structure. The semiconductor package includes a substrate with a top surface, a lid over the top surface of the substrate, and at least one substrate-mounted component mounted on the top surface of the substrate. Herein, a cavity is defined within the lid and over the top surface of the substrate. The substrate includes a metal pad over the top surface of the substrate. The lid includes a lid conductive structure, a lid body, and a perimeter wall that extends from a perimeter of the lid body toward the top surface of the substrate. The lid conductive structure includes a body conductor that extends through a portion of the lid body and a wall conductor that is coupled to the body conductor, extends through the perimeter wall, and is electronically coupled to the metal pad.

19 Claims, 7 Drawing Sheets

Figure 1A:
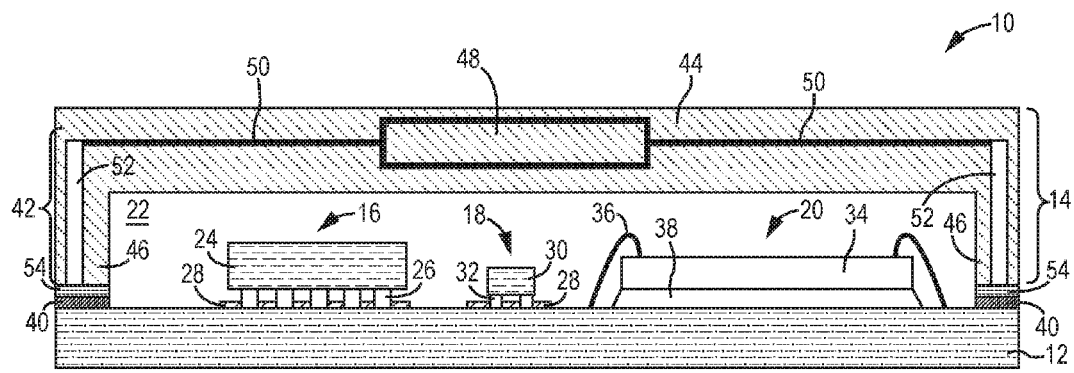

(51) Int. Cl.
*H01L 23/538* (2006.01)
*H01L 23/00* (2006.01)
*H01L 25/00* (2006.01)

(52) U.S. Cl.
CPC .......... *H01L 25/162* (2013.01); *H01L 25/50* (2013.01); *H01L 2224/48091* (2013.01); *H01L 2924/1205* (2013.01); *H01L 2924/1206* (2013.01); *H01L 2924/1207* (2013.01)

(58) Field of Classification Search
USPC .................................................. 257/704, 724
See application file for complete search history.

(56) References Cited

U.S. PATENT DOCUMENTS

| | | | | |
|---|---|---|---|---|
| 6,476,463 | B1* | 11/2002 | Kaneko | H01L 23/552 257/660 |
| 7,166,910 | B2* | 1/2007 | Minervini | B81B 7/0064 257/704 |
| 7,187,073 | B2* | 3/2007 | Shoji | H01L 23/10 206/710 |
| 8,018,049 | B2* | 9/2011 | Minervini | B81B 7/0061 257/704 |
| 8,258,637 | B2 | 9/2012 | Sakamoto et al. | |
| 8,742,570 | B2* | 6/2014 | Shenoy | B81C 1/00238 257/414 |
| 8,836,111 | B2* | 9/2014 | Conti | H04R 19/005 257/724 |
| 8,853,564 | B2* | 10/2014 | Lo | B81B 7/007 174/551 |
| 9,293,422 | B1* | 3/2016 | Parsa | H01L 31/109 |
| 2002/0036227 | A1 | 3/2002 | Milewski et al. | |
| 2005/0285131 | A1* | 12/2005 | Gallup | G02B 6/4277 257/99 |
| 2007/0108634 | A1* | 5/2007 | Higashi | H01L 23/04 257/787 |
| 2010/0072564 | A1* | 3/2010 | Saitoh | B81B 7/0061 257/415 |
| 2014/0145315 | A1 | 5/2014 | Lim | |
| 2014/0321803 | A1 | 10/2014 | Thacker et al. | |

OTHER PUBLICATIONS

Author Unknown, "Package on package," Wikipedia, The Free Encylopedia, last modified: Dec. 25, 2015, 4 pages, https://en.wikipedia.org/wiki/Package_on_package.

Norris, K. C. et al., "Reliability of Controlled Collapse Interconnections," IBM Journal of Research and Development, vol. 13, No. 3, May 1969, pp. 266-271.

Zhao, Renzhe et al., "Processing of Fluxing Underfills for Flip Chip on-Laminate Assembly," IEEE Transactions on Electronics Packaging Manufacturing, vol. 26, No. 1, Jan. 2003, 18 pages.

Non-Final Office Action for U.S. Appl. No. 15/085,458, mailed Dec. 16, 2016, 10 pages.

Notice of Allowance for U.S. Appl No. 15/085,458, dated Jun. 9, 2017, 8 pages.

* cited by examiner

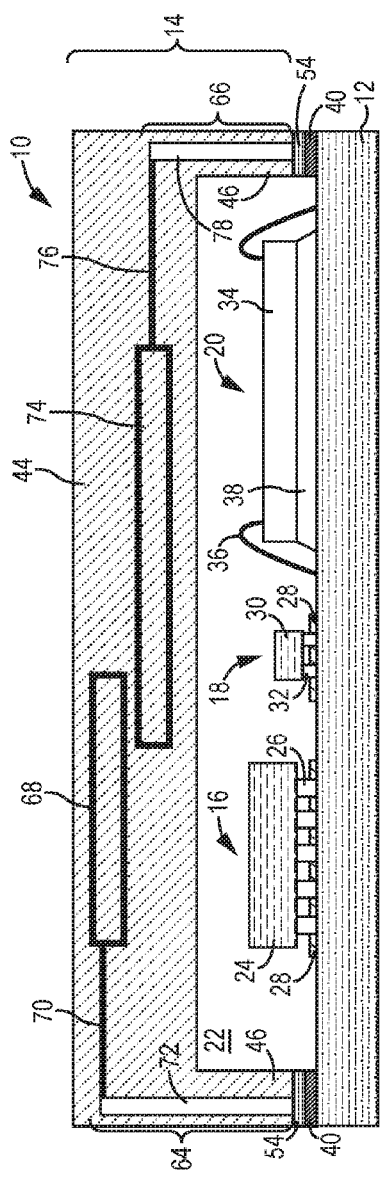
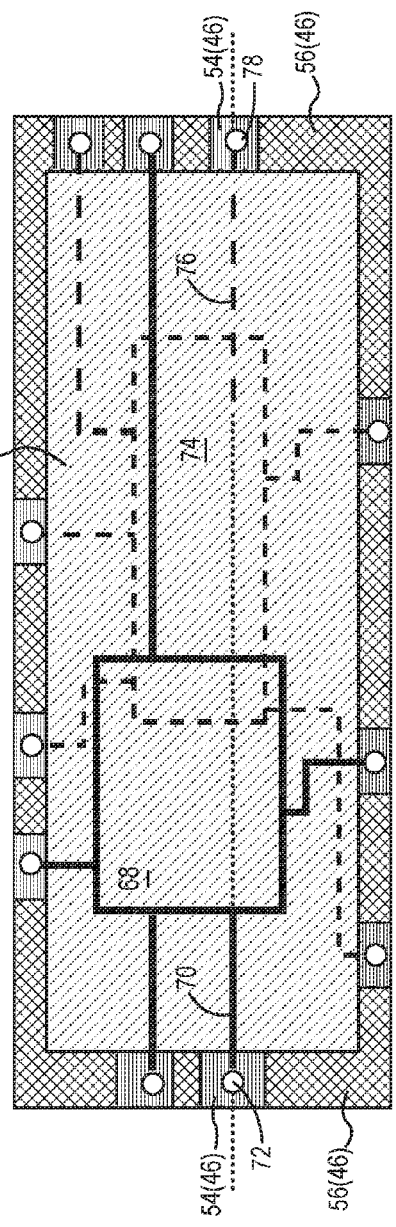
FIG. 3A
FIG. 3B

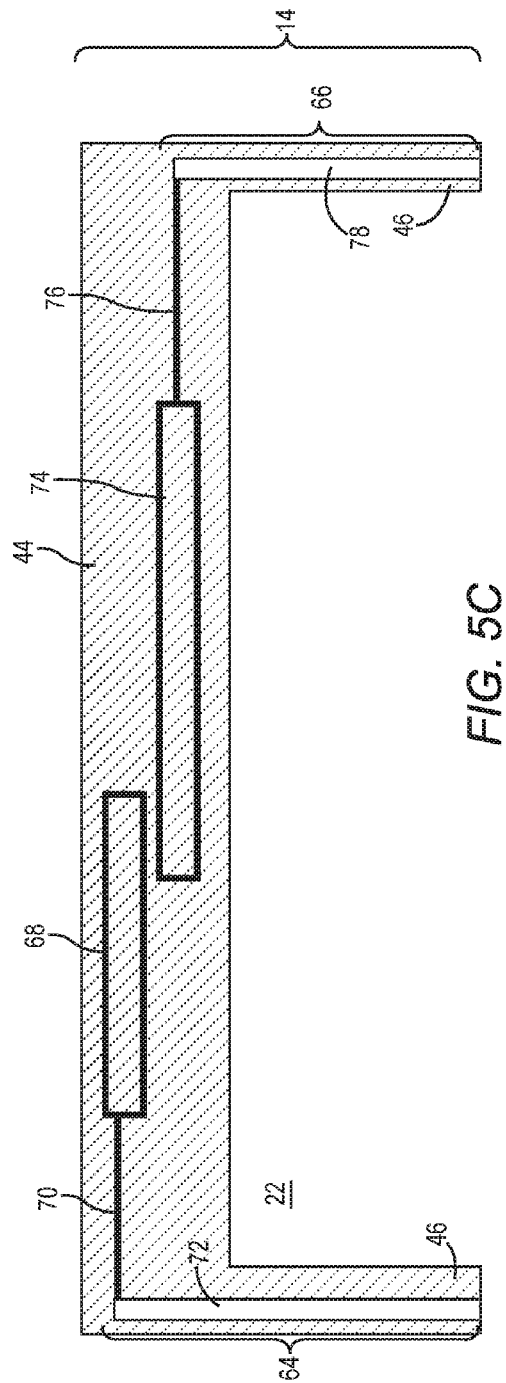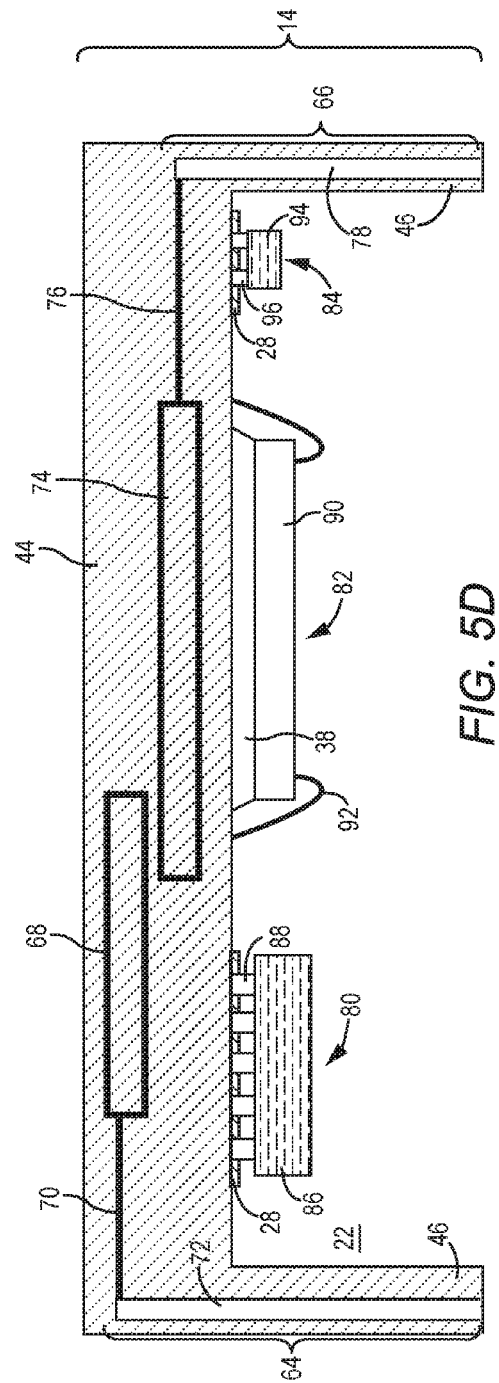

SEMICONDUCTOR PACKAGE WITH LID HAVING LID CONDUCTIVE STRUCTURE

RELATED APPLICATIONS

This application claims the benefit of provisional patent application Ser. No. 62/294,381, filed Feb. 12, 2016, the disclosure of which is hereby incorporated herein by reference in its entirety.

FIELD OF THE DISCLOSURE

The present disclosure relates to a semiconductor package with a lid and a process for making the same, and more particularly to a semiconductor package with a lid that includes a lid conductive structure, and a process to form the semiconductor package including the lid conductive structure.

BACKGROUND

In semiconductor packaging, mold compounds are normally used to encapsulate flip-chip dies and or wire-bonding dies to protect the dies against damage from the outside environment. Further, the mold compounds are also used to underfill the flip-chip dies to provide mechanical support to interconnects of the flip-chip dies. However, direct contact of the mold compounds and active die surfaces may adversely impact the electrical performance of the dies, especially for dies that support high frequency applications. Accordingly, it is desirable to package the dies in a configuration for better high frequency performance.

With developed semiconductor fabrication technology and popularity of portable communication electronic devices, such as cellular phones, tablet computers, and so forth, high levels of integration of semiconductor packages are highly desired. Package on package (POP), which stacks two or more semiconductor packages vertically, is a semiconductor packaging technology that allows higher electronics density in final products. POP benefits small printed-circuit-board areas and short trace lengths between different semiconductor packages. However, for applications that have thickness limitations, POP may not meet the thickness or performance requirement.

Accordingly, there remains a need for improved package designs to increase the integration level of semiconductor packages and enhance the high frequency performance of the semiconductor packages without significantly increasing the package size. In addition, there is also a need to keep the final product cost effective.

SUMMARY

The present disclosure relates to a semiconductor package with a lid that includes a lid conductive structure and a process for making the same. The disclosed semiconductor package includes a substrate with a top surface, a lid over the top surface of the substrate, and at least one substrate-mounted component. Herein, a cavity is defined within the lid and over the top surface of the substrate. The substrate includes a metal pad over the top surface of the substrate. The lid includes a lid conductive structure, a lid body, and a perimeter wall that extends from a perimeter of the lid body toward the top surface of the substrate. The lid conductive structure includes a body conductor that extends through a portion of the lid body and a wall conductor that is coupled to the body conductor, extends through the perimeter wall, and is electronically coupled to the metal pad. The at least one substrate-mounted component is mounted on the top surface of the substrate and exposed to the cavity.

According to an exemplary process, a lid including a lid conductive structure, a lid body, and a perimeter wall that extends from a perimeter of the lid body is formed. The lid conductive structure includes a body conductor extending through a portion of the lid body, and a wall conductor coupled to the body conductor and extending through the perimeter wall. Next, a package precursor is provided. The package precursor includes a substrate with a top surface and at least one substrate-mounted component mounted on the top surface of the substrate. The substrate includes a metal pad over the top surface of the substrate. Finally, the lid is attached to the package precursor. The perimeter wall is coupled to the substrate, and the wall conductor is electronically coupled to the metal pad over the top surface of the substrate. Herein, a cavity is defined within the lid and over the top surface of the substrate, and the at least one substrate-mounted component is exposed to the cavity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1B:
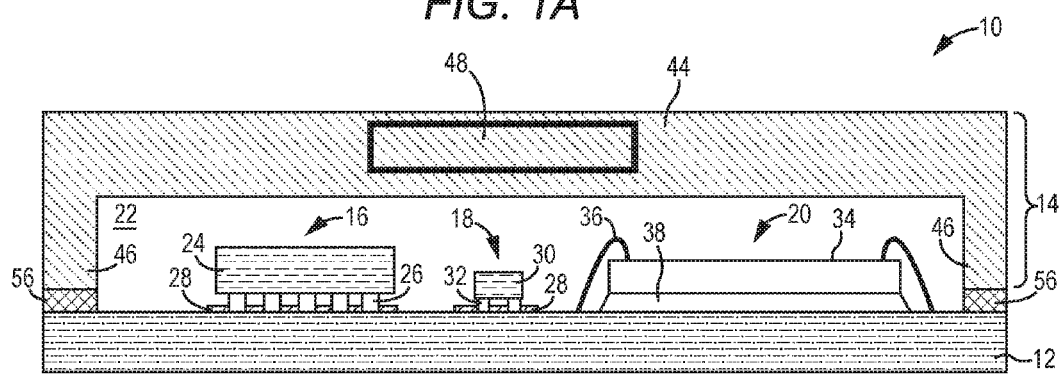
Figure 1C:
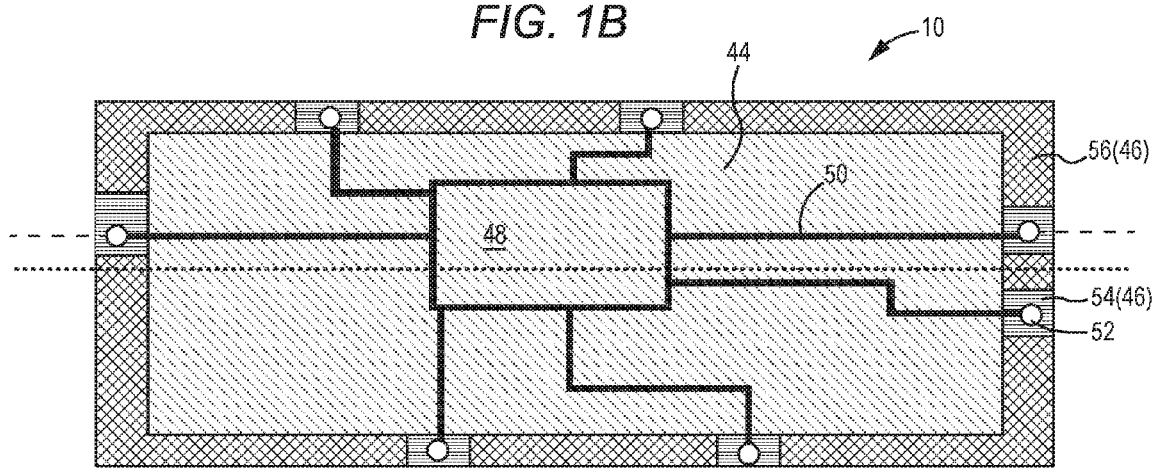

FIGS. 1A-1C provide an exemplary semiconductor package with a lid that includes a lid conductive structure according to one embodiment of the present disclosure.

Figure 2A:
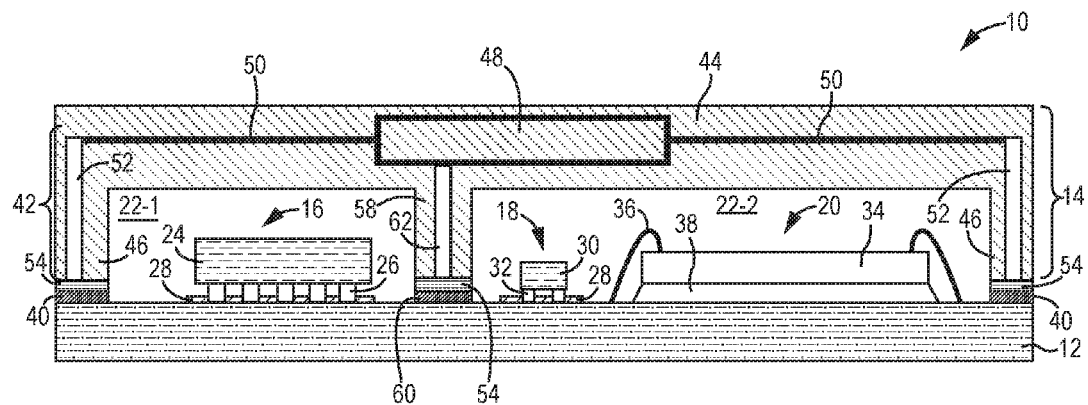
Figure 2B:
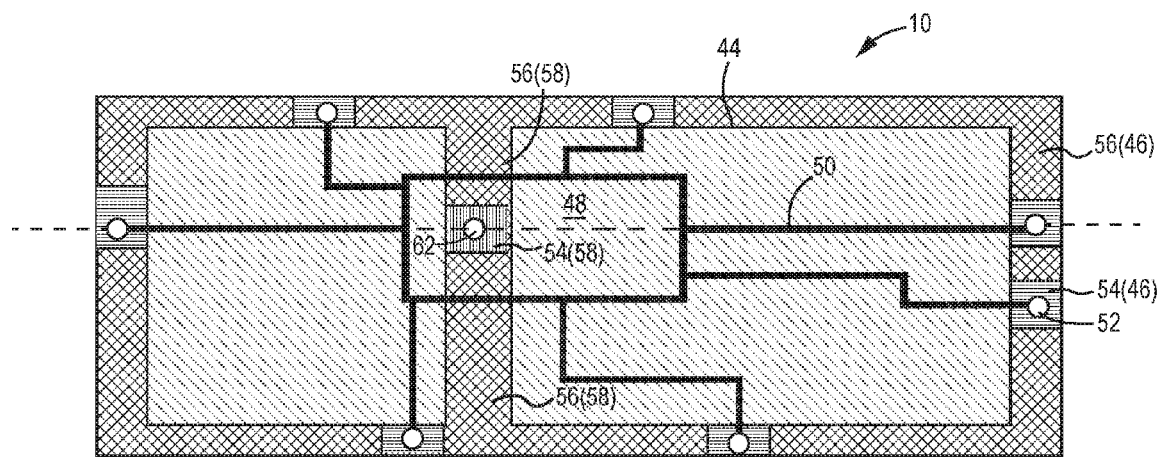

FIGS. 2A-2B provide an alternative semiconductor package with a lid that includes a lid conductive structure according to one embodiment of the present disclosure.

FIGS. 3A-3B provide an exemplary semiconductor package with a lid that includes multiple lid conductive structures according to one embodiment of the present disclosure.

Figure 4:
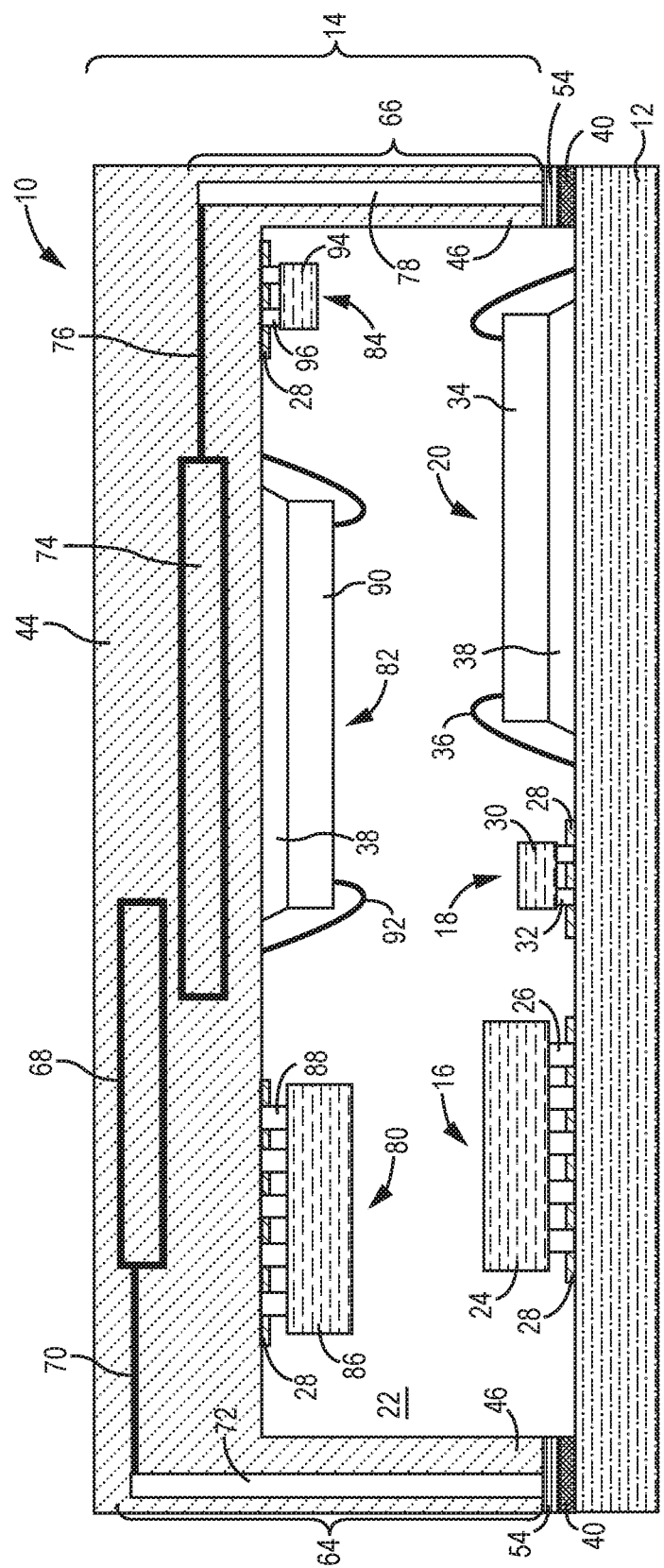

FIG. 4 provides an alternative semiconductor package with a lid that includes multiple lid conductive structures according to one embodiment of the present disclosure.

FIGS. 5A-5F illustrate an exemplary process to form the exemplary semiconductor package shown in FIG. 4 according to one embodiment of the present disclosure.

It will be understood that for clear illustrations, FIGS. 1A-5F may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIGS. 1A-1B show cross-sectional views of an exemplary semiconductor package 10 according to one embodiment of the present disclosure. FIG. 1C is a top view of the semiconductor package 10. The semiconductor package 10 shown in FIG. 1A illustrates the cross-sectional view at the dashed-line in FIG. 1C, and the semiconductor package 10 shown in FIG. 1B illustrates the cross-sectional view at the dotted-line in FIG. 1C.

For the purpose of this illustration, the semiconductor package 10 includes a substrate 12 with a top surface, a lid 14 over the top surface of the substrate 12, a first flip-chip die 16, a first surface mounted device (SMD) 18, and a first wire-bonding die 20. In different applications, the semiconductor package 10 may include fewer or more flip-chip dies/SMDs/wire-bonding dies.

As shown in FIG. 1A, the first flip-chip die 16, the first SMD 18, and the first wire-bonding die 20 are mounted on the top surface of the substrate 12 and exposed to a cavity 22, which is defined within the lid 14 and over the top surface of the substrate 12. In detail, the first flip-chip die 16 includes a first flip-chip die body 24 and a number of first flip-chip interconnects 26 extending outward from a bottom surface of the first flip-chip die body 24 (only one first flip-chip interconnect 26 is labeled with a reference number to avoid drawing clutter). Each first flip-chip interconnect 26 is coupled to the top surface of the substrate 12 through a reinforcement material 28, which is over the top surface of the substrate 12 and underneath the first flip-chip die body 24. Herein, the reinforcement material 28 provides superior reinforcement to each first flip-chip interconnect 26, and resists each first flip-chip interconnect 26 from cracking due to stresses from CTE mismatch (further details may be found in U.S. patent application Ser. No. 15/085,458, which is incorporated herein by reference). For high frequency applications, the reinforcement material 28 may only encapsulate a small portion (20%~40%) of each first flip-chip interconnect 26 adjacent to the top surface of the substrate 12, such that the bottom surface of the first flip-chip die body 24 is exposed. Consequently, the reinforcement material 28 has a low impact on electrical signals propagating from the first flip-chip die 16 to the substrate 12 and vice-versa.

Similarly, the first SMD 18 includes a first SMD body 30 and a number of first SMD interconnects 32 extending outward from a bottom surface of the first SMD body 30 and coupled to the top surface of the substrate 12 (only one first SMD interconnect 32 is labeled with a reference number to avoid drawing clutter). The reinforcement material 28 may also be applied underneath the first SMD body 30 and may encapsulate a portion of each first SMD interconnect 32 adjacent to the top surface of the substrate 12. The reinforcement material 28 may provide superior reinforcement to each first SMD interconnect 32, and may resist each first SMD interconnect 32 from cracking due to stresses from CTE mismatch.

In some applications, especially low frequency applications, an underfilling material may be used (not shown) instead of the reinforcement material 28 in the semiconductor package 10. Different from the reinforcement material 28, the underfilling material completely fills the entire space between the first flip-chip die 16 and the top surface of the substrate 12 and fully encapsulates the first flip-chip interconnects 26. Also, the underfilling material completely fills the entire space between the first SMD 18 and the top surface of the substrate 12 and fully encapsulates the first SMD interconnects 32. The underfilling material may be formed from mold compounds or capillary underfill formulations.

In addition, the first wire-bonding die 20 includes a first wire-bonding die body 34 and a number of first wires 36 (only one first wire 36 is labeled with a reference number to avoid drawing clutter). The first wire-bonding die body 34 has a top surface and a bottom surface, which is opposite the top surface of the first wire-bonding die body 34. The first wire-bonding die body 34 is attached to the top surface of the substrate 12 by a die-attach material 38, where the bottom surface of the first wire-bonding die body 34 is in contact with the die-attach material 38. Each first wire 36 extends outward from the top surface of the first wire-bonding die body 34 and is coupled to the top surface of the substrate 12. Each first wire 36 and the top surface of the first wire-bonding die body 34 are exposed to the cavity 22, such that the first wire-bonding die 20 may have superior performance in high frequency applications.

Further, the substrate 12 may be a multi-layer substrate (not shown) and may include metal pads 40 over the top surface of the substrate 12. To simplify the illustration of the semiconductor package 10, the present disclosure does not show how to couple the first flip-chip die 16/the first SMD 18/the first wire-bonding die 20 to the multiple layers (not shown) in the substrate 12. The lid 14 includes a lid conductive structure 42, a lid body 44, and a perimeter wall 46 that extends from a perimeter of the lid body 44 toward the top surface of the substrate 12. The lid conductive structure 42 includes an integrated structure 48, body conductors 50, and wall conductors 52. The integrated structure 48 resides within the lid body 44. Each body conductor 50 extends through a portion of the lid body 44, and is coupled between the integrated structure 48 and a corresponding wall conductor 52. Each wall conductor 52 extends through the perimeter wall 46 toward a corresponding metal pad 40 over the top surface of the substrate 12. The body conductors 50 may be formed from copper as routing traces. The wall conductors 52 may be formed from filled or barrel plated copper as conductive vias. The integrated structure 48 may include routing traces and or at least one passive component, such as a resistor, a capacitor, and an inductor (not shown).

In order to attach the lid 14 to the substrate 12 securely, a first lid-attach material 54 and a second lid-attach material 56 may be applied between the perimeter wall 46 and the substrate 12. The first lid-attach material 54 is conductive and may be formed from solders, sintered materials, or conductive epoxy; and the second lid-attach material 56 is non-conductive and may be formed from non-electrically-conductive epoxy. As illustrated in FIGS. 1A and 1C, the first lid-attach material 54 is applied between the metal pads 40 and the perimeter wall 46, and in contact with each wall conductor 52. Consequently, each metal pad 40 is electronically coupled to a corresponding wall conductor 52, respectively. As illustrated in FIGS. 1B and 1C, the second lid-attach material 56 is applied underneath the perimeter wall 46 and over the top surface of the substrate 12 except portions where the metal pads 40 are located. The second lid-attach material 56 is typically not in contact with any of the wall conductors 52. In FIG. 1C, only one body conductor 50, one wall conductor 52, a portion of the first lid-attach material 54, and a portion of the second lid-attach material 56 are labeled with reference numbers to avoid drawing clutter.

For some applications, as shown in FIGS. 2A-2B, the lid 14 may further include an inner wall 58 extending from a bottom surface of the lid body 44 towards the top surface of the substrate 12. Herein, the bottom surface of the lid body 44 faces the top surface of the substrate 12. The semiconductor package 10 shown in FIG. 2A illustrates a cross-sectional view at the dashed-line in FIG. 2B. The inner wall 58 divides the cavity 22 into a first cavity 22-1 and a second cavity 22-2, both of which are defined within the lid 14 and over the top surface of the substrate 12. The flip-chip die 16 is exposed to the first cavity 22-1, and the SMD 18 and the wire-bonding die 20 are exposed to the second cavity 22-2. The substrate 12 may further include an inner metal pad 60 over the top surface of the substrate 12, and the lid conductive structure 42 may further include an inner wall conductor 62 that is coupled to the integrated structure 48 and extends through the inner wall 58 toward the inner metal pad 60. The first lid-attach material 54 is applied between the inner metal pad 60 and the inner wall 58, and in contact with the inner wall conductor 62. The second lid-attach material 56 is applied underneath the inner wall 58 and over the top surface of the substrate 12 except a portion where the inner metal pad 60 is located. The second lid-attach material 56 is typically not in contact with the inner wall conductor 62.

In another embodiment, the lid 14 may include multiple lid conductive structures. For the purpose of this illustration, the lid 14 includes a first lid conductive structure 64 and a second lid conductive structure 66 as depicted in FIGS. 3A-3B. The semiconductor package 10 shown in FIG. 3A illustrates a cross-sectional view at the dotted-line in FIG. 3B.

In detail, the first lid conductive structure 64 includes a first integrated structure 68, first body conductors 70, and first wall conductors 72 (in FIG. 3B, only one first body conductor 70, one first wall conductor 72, portions of the first lid-attach material 54, and portions of the second lid-attach material 56 are labeled with reference numbers to avoid drawing clutter). The first integrated structure 68 resides within a first level of the lid body 44. Each first body conductor 70 extends through a portion of the first level of the lid body 44, and is coupled between the first integrated structure 68 and a corresponding first wall conductor 72. Each first wall conductor 72 extends from the first level of the lid body 44 and through the perimeter wall 46. Each first wall conductor 72 is coupled to a corresponding metal pad 40 by the first lid-attach material 54 over the corresponding metal pad 40. The first integrated structure 68 may include routing traces and or at least one passive component, such as a resistor, a capacitor, and an inductor (not shown). The first body conductors 70 may be formed from copper as routing traces. The first wall conductors 72 may be formed from filled or barrel plated copper as conductive vias.

Similarly, the second lid conductive structure 66 includes a second integrated structure 74, second body conductors 76, and second wall conductors 78 (in FIG. 3B, only one second body conductor 76 and one second wall conductor 78 are labeled with reference numbers to avoid drawing clutter). The second integrated structure 74 resides within a second level of the lid body 44, which is different from the first level of the lid body 44. Each second body conductor 76 extends through a portion of the second level of the lid body 44, and is coupled between the second integrated structure 74 and a corresponding second wall conductor 78. Each second wall conductor 78 extends from the second level of the lid body 44 and through the perimeter wall 46. Each second wall conductor 78 is coupled to a corresponding metal pad 40 by the first lid-attach material 54 over the corresponding metal pad 40. The second integrated structure 66 may include routing traces and or at least one passive component, such as a resistor, a capacitor, and an inductor (not shown). The second body conductors 76 may be formed from copper as routing traces. The second wall conductors 78 may be formed from filled or barrel plated copper as conductive vias.

In another embodiment, when the lid 14 includes multiple lid conductive structures, the semiconductor package 10 may further include electronic components mounted on the bottom surface of the lid body 44 that faces the top surface of the substrate 12. For the purpose of this illustration, the semiconductor package 10 further includes a second flip-chip die 80, a second wire-bonding die 82, and a second SMD 84 as depicted in FIG. 4. The second flip-chip die 80, the second wire-bonding die 82, and the second SMD 84 are mounted on the bottom surface of the lid body 44, and exposed to the cavity 22. To simplify the illustration of the semiconductor package 10, the present disclosure does not show how to couple the second flip-chip die 80/the second wire-bonding die 82/the second SMD 84 to the first/second lid conductive structures 64/66 in the lid 14.

Similar to the first flip-chip die 16, the second flip-chip die 80 includes a second flip-chip die body 86 and a number of second flip-chip interconnects 88 that extend from a bottom surface of the second flip-chip die body 86 towards the bottom surface of the lid body 44 (only one second flip-chip interconnect 88 is labeled with a reference number to avoid drawing clutter). The reinforcement material 28 may be applied over the bottom surface of the lid body 44 and underneath the second flip-chip die body 86. For high frequency applications, the reinforcement material 28 may only encapsulate a small portion (20%~40%) of each second flip-chip interconnect 88 adjacent to the bottom surface of the lid body 44, such that the bottom surface of the second flip-chip die body 86 is exposed. Similar to the first wire-bonding die 20, the second wire-bonding die 82 includes a second wire-bonding die body 90 and a number of second wires 92 (only one second wire 92 is labeled with a reference number to avoid drawing clutter). A bottom surface of the second wire-bonding die body 90 is coupled to the bottom surface of the lid 14 by the die-attach material 38. Each second wire 92 extends outward from a top surface of the second wire-bonding die body 90 and is coupled to the bottom surface of the lid body 44. Herein, each second wire 92 and the top surface of the second wire-bonding die body 90 are exposed to the cavity 22. In addition, similar to the first SMD 18, the second SMD 84 has a second SMD body 94 and a number of second SMD interconnects 96 extending outward from a bottom surface of the second SMD body 94 and coupled to the bottom surface of the lid body 44 (only one second SMD interconnect 96 is labeled with a reference number to avoid drawing clutter). A portion of each second SMD interconnect 96 may be encapsulated by the reinforcement material 28.

For low frequency applications, an underfilling material (not shown) instead of the reinforcement material 28 may be used to encapsulate the second flip-chip interconnects 88 of the second flip-chip die 80 and the second SMD interconnect 96 of the second SMD 84. Different from the reinforcement material 28, the underfilling material completely fills the entire space between the second flip-chip die 80 and the bottom surface of the lid body 44 and the entire space between the second SMD 84 and the bottom surface of the lid body 44.

It will be clear to those skilled in the art that mounting electronic components (flip-chip dies/SMDs/wire-bonding dies) on both the top surface of the substrate 12 and the bottom surface of the lid body 44 will increase the integration level of the semiconductor package 10 without significantly increasing the package size. In addition, integrating passive components (resistors/capacitors/inductors) into the lid body 44 will shorten trace lengths from the passive components to the electronic components, thereby further saving the footprint of the semiconductor package 10 and improving the performance of the semiconductor package 10.

FIGS. 5A-5F illustrate an exemplary process to form the exemplary flip-chip package 10 shown in FIG. 4. Although the exemplary process is illustrated as a series of sequential steps, the exemplary process is not necessarily order dependent. Some operations may be done in a different order than that presented. Further, processes within the scope of this disclosure may include fewer or more operations than those illustrated in FIGS. 5A-5F.

Figure 5A:
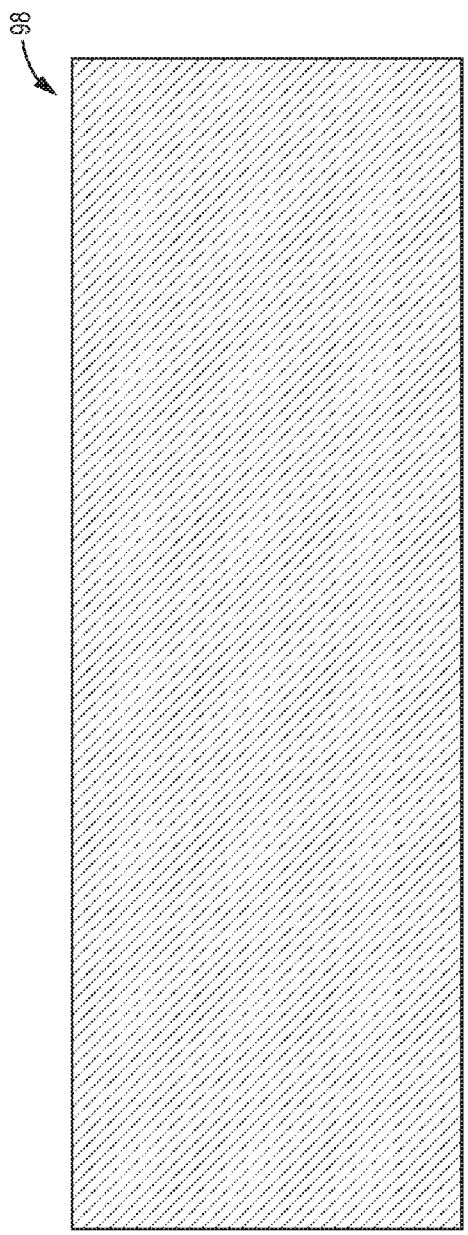
Figure 5B:
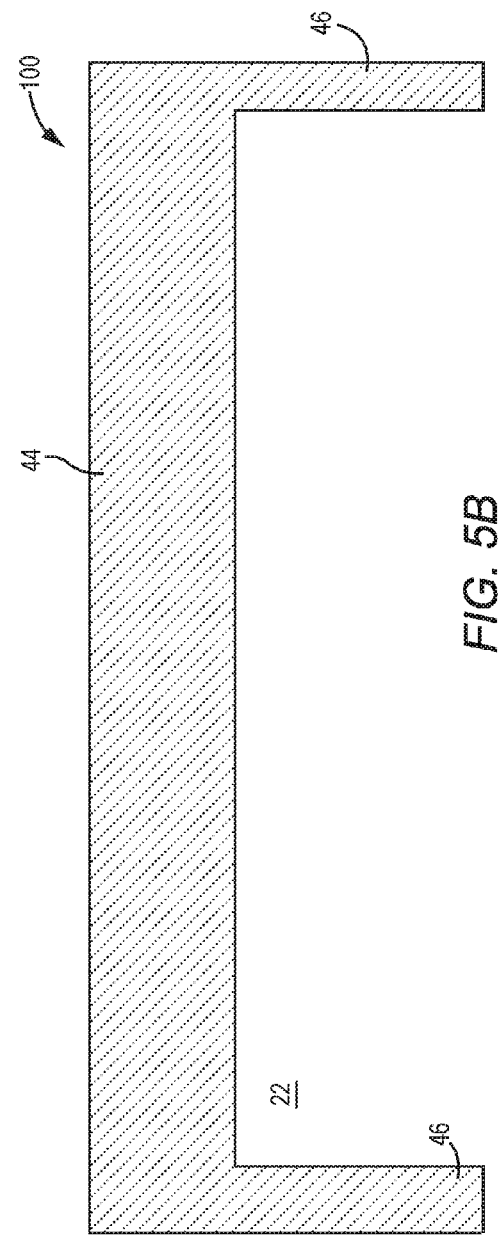

FIGS. 5A-5C illustrate an exemplary process to form the lid 14 with the first lid conductive structure 64 and the second lid conductive structure 66. Initially, a lid precursor 98 is provided as depicted in FIG. 5A. The lid precursor 98 may be formed from polyimide, Teflon based dielectrics, materials that contain Bismaleimide-Triazine resin and glass weave, or the like. Then, a portion of the lid precursor 98 is removed to form a basic lid 100 with the cavity 22 as depicted in FIG. 5B. The basic lid 100 includes the lid body 44 and the perimeter wall 46 that extends from the perimeter of the lid body 44. The lid body 44 has the bottom surface exposed to the cavity 22. The removal process may be provided by a mechanical removal process, a chemical removal process, or a laser based removal process.

Next, the first lid conductive structure 64 and the second lid conductive structure 66 are integrated into the basic lid 100 to form the lid 14 as depicted in FIG. 5C. The first lid conductive structure 64 includes the first integrated structure 68, the first body conductor 70, and the first wall conductor 72. The first integrated structure 68 resides within the first level of the lid body 44. The first body conductor 70 extends through a portion of the first level of the lid body 44, and is coupled between the first integrated structure 68 and the first wall conductor 72. The first wall conductor 72 extends from the first level of the lid body 44 through the perimeter wall 46. The second lid conductive structure 66 includes the second integrated structure 74, the second body conductor 76, and the second wall conductor 78. The second integrated structure 74 resides within the second level of the lid body 44, which is different from the first level of the lid body 44. The second body conductor 76 extends through a portion of the second level of the lid body 44, and is coupled between the second integrated structure 74 and the second wall conductor 78. The second wall conductor 78 extends from the second level of the lid body 44 through the perimeter wall 46.

After the lid 14 is formed, the second flip-chip die 80, the second wire-bonding die 82, and the second SMD 84 are mounted to the bottom surface of the lid body 44 as depicted in FIG. 5D. The second flip-chip die 80 includes the second flip-chip die body 86 and the second flip-chip interconnects 88 that extend from the bottom surface of the second flip-chip die body 86. Mounting the second flip-chip die 80 is provided by attaching the second flip-chip interconnects 88 to the bottom surface of the lid body 44 through the reinforcement material 28. The reinforcement material 28 encapsulates a portion of each second flip-chip interconnect 88, such that the bottom surface of the second flip-chip die body 86 is exposed. If an underfilling material is used (not shown) instead of the reinforcement material 28, mounting the second flip-chip die 80 is provided by attaching the second flip-chip interconnects 88 to the bottom surface of the lid body 44 through the underfilling material. The underfilling material completely fills the entire space between the second flip-chip die 80 and the bottom surface of the lid body 44, such that the underfilling material fully encapsulates the second flip-chip interconnects 88 of the second flip-chip die 80.

The second wire-bonding die 82 includes the second wire-bonding die body 90 and the second wires 92. Mounting the second wire-bonding die 82 is provided by attaching the bottom surface of the second wire-bonding die body 90 to the bottom surface of the lid body 44 by the die-attach material 38, and extending the second wires 92 outward from the top surface of the second wire-bonding die body 90 to the bottom surface of the lid body 44. Herein, each second wire 92 and the top surface of the second wire-bonding die body 90 are exposed to the cavity 22.

In addition, the second SMD 84 has the second SMD body 94 and the second SMD interconnects 96 that extend outward from the bottom surface of the second SMD body 94. Mounting the second SMD 84 is provided by attaching the second SMD interconnects 96 to the bottom surface of the lid body 44. A portion of each second SMD interconnect 96 may be encapsulated by the reinforcement material 28 over the bottom surface of the lid body 44. If an underfilling material is used (not shown) instead of the reinforcement material 28, the underfilling material completely fills the entire space between the second SMD 84 and the bottom surface of the lid body 44, such that the underfilling material fully encapsulates the second SMD interconnects 96 of the second SMD 84.

Figure 5E:
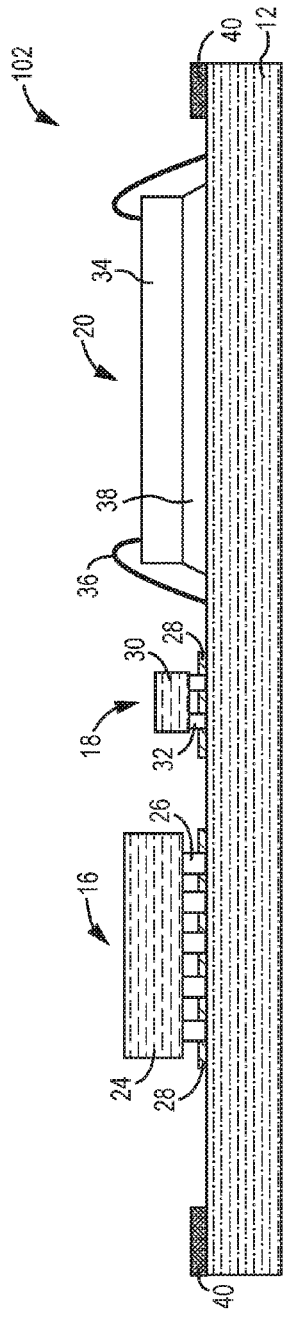

Next, a package precursor 102 is provided as depicted in FIG. 5E. The package precursor 102 includes the substrate 12 having the top surface with the metal pads 40, the first flip-chip die 16, the first SMD 18, and the first wire-bonding die 20. The first flip-chip die 16 includes the first flip-chip die body 24 and the first flip-chip interconnects 26 that extend from the bottom surface of the first flip-chip die body 24 to the top surface of the substrate 12 through the reinforcement material 28. The reinforcement material 28 encapsulates a portion of each first flip-chip interconnect 26, such that the bottom surface of the first flip-chip die body 24 is exposed. The first SMD 18 includes the first SMD body 30 and the first SMD interconnects 32 that extend outward from the bottom surface of the first SMD body 30 to the top surface of the substrate 12. A portion of each first SMD interconnect 32 may be encapsulated by the reinforcement material 28 over the top surface of the substrate 12. If an underfilling material is used (not shown) instead of the reinforcement material 28, the underfilling material completely fills the entire space between the second flip-chip die 80 and the bottom surface of the lid body 44, such that the underfilling material fully encapsulates the second flip-chip interconnects 88 of the second flip-chip die 80. Also, the underfilling material completely fills the entire space between the second SMD 84 and the bottom surface of the lid body 44, such that the underfilling material fully encapsulates the second SMD interconnects 96 of the second SMD 84.

In addition, the first wire-bonding die 20 includes the first wire-bonding die body 34 and the first wires 36. The first wire-bonding die body 34 is attached to the top surface of the substrate 12 by the die-attach material 38, where the bottom surface of the first wire-bonding die body 34 is in contact with the die-attach material 38. Each first wire 36 extends outward from the top surface of the first wire-bonding die body 34 and is coupled to the top surface of the substrate 12. Herein, each first wire 36 and the top surface of the first wire-bonding die body 34 are exposed to the cavity 22.

Figure 5F:
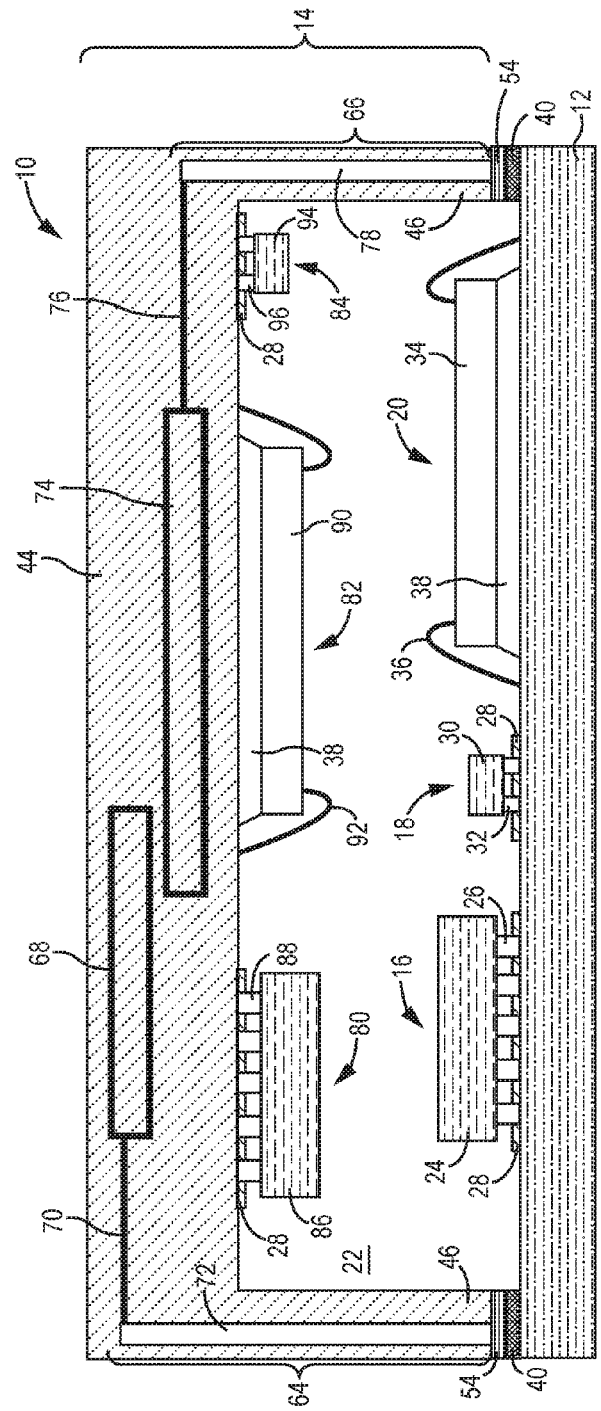

Finally, the lid 14 is attached to the package precursor 102 to form the semiconductor package 10 as depicted in FIG. 5F. The perimeter wall 46 is coupled to the substrate 12 by the first lid-attach material 54 and the second lid-attach material 56 (not shown). The first lid-attach material 54 is applied between the metal pads 40 and the perimeter wall 46, and in contact with the first wall conductor 72 and the second wall conductor 78. The second lid-attach material (not shown) is applied underneath the perimeter wall 46 and over the top surface of the substrate 12 except portions where the metal pads 40 are located. The second lid-attach material 56 is not in contact with the first wall conductor 72 or the second wall conductor 78.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a substrate with a top surface comprising a first metal pad over the top surface of the substrate;
   a lid over the top surface of the substrate comprising a first lid conductive structure, a lid body, and a perimeter wall that extends from a perimeter of the lid body toward the top surface of the substrate, wherein:
   a cavity is defined within the lid and over the top surface of the substrate; and
   the first lid conductive structure comprises a first body conductor that extends through a portion of the lid body and a first wall conductor that is coupled to the first body conductor, extends through the perimeter wall, and is electronically coupled to the first metal pad; and
   at least one substrate-mounted component mounted on the top surface of the substrate and exposed to the cavity.

2. The apparatus of claim 1 wherein the first lid conductive structure further comprises a first integrated structure that resides within the lid body and is coupled to the first body conductor.

3. The apparatus of claim 2 wherein the first integrated structure comprises at least one from a group consisting of a resistor, a capacitor and an inductor.

4. The apparatus of claim 2 wherein the first integrated structure comprises routing traces.

5. The apparatus of claim 4 wherein the first integrated structure further comprises at least one from a group consisting of a resistor, a capacitor and an inductor.

6. The apparatus of claim 1 wherein the at least one substrate-mounted component comprises a least one from a group consisting of a flip-chip die, a wire-bonding die, and a surface mounted device (SMD).

7. The apparatus of claim 1 wherein the lid further comprises a second lid conductive structure and the substrate further comprises a second metal pad over the top surface of the substrate, wherein:
   the second lid conductive structure comprises a second body conductor and a second wall conductor;
   the first body conductor resides within a first level of the lid body and the second body conductor resides within a second level of the lid body, which is different from the first level of the lid body; and
   the second wall conductor is coupled to the second body conductor and extends through the perimeter wall toward the second metal pad.

8. The apparatus of claim 7 wherein the first lid conductive structure further comprises a first integrated structure that resides within the first level of the lid body and is coupled to the first body conductor, and the second lid conductive structure further comprises a second integrated structure that resides within the second level of the lid body and is coupled to the second body conductor.

9. The apparatus of claim 8 wherein the second integrated structure comprises at least one from a group consisting of a resistor, a capacitor and an inductor.

10. The apparatus of claim 8 wherein the second integrated structure comprises routing traces.

11. The apparatus of claim 10 wherein the second integrated structure further comprises at least one from a group consisting of a resistor, a capacitor and an inductor.

12. The apparatus of claim 8 wherein the first integrated structure comprises at least one from a group consisting of a resistor, a capacitor and an inductor.

13. The apparatus of claim 8 wherein the first integrated structure comprises routing traces.

14. The apparatus of claim 13 wherein the first integrated structure further comprises at least one from a group consisting of a resistor, a capacitor and an inductor.

15. The apparatus of claim 7 wherein the lid body has a bottom surface that faces the top surface of the substrate, and at least one lid-mounted component is mounted on the bottom surface of the lid body, coupled to the first lid conductive structure, and exposed to the cavity.

16. The apparatus of claim 15 wherein the at least one lid-mounted component comprises a least one from a group consisting of a flip-chip die, a wire-bonding die, and a SMD.

17. The apparatus of claim 1 further comprising a first lid-attach material, wherein:

the first lid-attach material is applied between the first metal pad and the perimeter wall, and in contact with the first wall conductor; and the first lid-attach material is electrically conductive.

18. The apparatus of claim 17 further comprising a second lid-attach material, wherein:

the second lid-attach material is applied underneath the perimeter wall and over the top surface of the substrate except a portion where the first metal pad is located;

the second lid-attach material is not in contact with the first wall conductor; and the second lid-attach material is electrically non-conductive.

19. The apparatus of claim 1 wherein the lid further comprises an inner wall extending from a bottom surface of the lid body towards the top surface of the substrate, wherein:

the bottom surface of the lid body faces the top surface of the substrate;

the inner wall divides the cavity into a first cavity and a second cavity; and the at least one substrate-mounted component is exposed to the first cavity.

\* \* \* \* \*